US007781719B2

(12) United States Patent
Yang et al.

(10) Patent No.: US 7,781,719 B2
(45) Date of Patent: Aug. 24, 2010

(54) HIGH SENSITIVITY AND HIGH DYNAMIC-RANGE CMOS IMAGE SENSOR PIXEL STRUCTURE WITH DYNAMIC C-V CHARACTERISTICS

(75) Inventors: Kyoung-Hoon Yang, Daejeon (KR); Sung-Sik Lee, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 11/463,679

(22) Filed: Aug. 10, 2006

(65) Prior Publication Data

US 2008/0029794 A1 Feb. 7, 2008

(30) Foreign Application Priority Data

Aug. 4, 2006 (KR) .................... 10-2006-0073846

(51) Int. Cl.
*H01J 40/14* (2006.01)
*H03F 3/08* (2006.01)
(52) U.S. Cl. .............. 250/214 R; 250/208.1; 348/294; 348/308
(58) Field of Classification Search .............. 250/208.1, 250/214.1, 214 R, 214 DC; 348/229.1, 294, 348/297, 308; 257/72
See application file for complete search history.

(56) References Cited

U.S. PATENT DOCUMENTS 5,739,562 A * 4/1998 Ackland et al. ............. 257/291
7,135,362 B2 * 11/2006 Lee ............................ 438/199

OTHER PUBLICATIONS

Lai et al., "A new well capacity adjusting scheme for high sensitivity, extended dynamic range CMOS imaging pixel sensor", Japanese Journal of Applied Physics, vol. 44, No. 4B, Apr. 21, 2005, pp. 2214-2216.*
Fossum, "CMOS Image Sensors: Electronic Camera-On-A-Chip," IEEE Transactions on Electron Devices, vol. 44, No. 10, pp. 1689-1698, Oct. 1997.
Fossum, "Digital Camera System on a Chip," IEEE Micro, vol. 18(3), pp. 8-15, May-Jun. 1998.

(Continued)

*Primary Examiner*—Thanh X Luu
*Assistant Examiner*—Francis M Legasse, Jr.
(74) *Attorney, Agent, or Firm*—Greenblum & Bernstein, P.L.C.

(57) ABSTRACT

A new photogate pixel structure for high performance CMOS Image Sensors is proposed. A new photogate structure is incorporated into the photodiode active-pixel structure. The proposed pixel structure exhibits the dynamic integration capacitance characteristics, which can be controlled by varying the control-voltage at the photogate node. Since the sensitivity is inversely proportional to the integration capacitance, the dynamic integration capacitance characteristics can provide the new functionality and controllability for high sensitivity and high dynamic range. At a low voltage level of the photogate, the pixel sensitivity of the new photogate pixel structure is maximized due to the minimum value of the integration capacitance. At a high voltage of the photogate, the dynamic range of the new structure can be maximized due to the increased well capacity. In addition, at an optimum bias voltage of the photogate, both the dynamic-range and the sensitivity can be simultaneously improved. Consequently, the new pixel structure allows performance tunability as well as optimization in both the dynamic range and the sensitivity of the image sensor cell.

5 Claims, 10 Drawing Sheets

OTHER PUBLICATIONS

Wong, "Technology and Device Scaling Considerations for CMOS Imagers," IEEE Transactions on Electron Devices, vol. 43, No. 12, pp. 2131-2142, Dec. 1996.

Abe, "Device Technologies for High Quality and Smaller Pixel in CCD and CMOS Image Sensors," in IEDM Dig. Tech. Papers, 2004, pp. 989-992.

Takahashi et al, "A 3.9-μm Pixel Pitch VGA Format 10-b Digital Output CMOS Image Sensor With 1.5 Transistor/Pixel," IEEE Journal of Solid-State Circuits, vol. 39, No. 12, pp. 2417-2425, Dec. 2004.

Lee et al., "High Dynamic-Range CMOS Image Sensor Cell Based on Self-Adaptive Photosensing Operation," IEEE Transactions on Electron Devices, vol. 53, No. 7, pp. 1733-1735, Jul. 2006.

* cited by examiner

HIGH SENSITIVITY AND HIGH DYNAMIC-RANGE CMOS IMAGE SENSOR PIXEL STRUCTURE WITH DYNAMIC C-V CHARACTERISTICS

BACKGROUND OF THE INVENTION

1. Field of the Invention

The present invention relates to a pixel structure and novel operational characteristics for high performance CMOS Image Sensors. More specifically, the present invention relates to a novel electrical operation of the dynamic C-V characteristic with a transition voltage, which can be controlled by varying the photogate bias voltage, for high sensitivity and high dynamic-range performance using a new photogate pixel structure in high-end digital still cameras and high performance digital video cameras.

2. Description of the Related Art

Today, advances and improvements continue to be made in the growing digital imaging world. Apart from the existing applications in fax machines, scanners, security cameras and camcorders, new markets are emerging in the consumer imaging industry such as digital still cameras, toys and PC cameras, cameras for cell phones and PDAs, biometrics, and automobiles.

The two main silicon-based image sensor technologies are charge-coupled devices (CCDs) and CMOS image sensors (CISs). Up until the mid-1990s, CCDs have been the dominant technology in the imaging world, while traditional ICs are fabricated with the CMOS technology. Since then, however, there has been a growing interest in the development of CMOS image sensors in the [1]. ([1]: E. R. Fossum et al, "CMOS image sensors: Electronic camera-on-a-chip," IEEE Transactions on Electron Devices, vol. 44, No. 10, pp. 1689-1698, October 1997) The first CCD was reported by Bell Labs in 1970.

It was adopted over other solid-state image sensors, including CIS, because of its reduced fixed pattern noise (FPN) and smaller pixel size. In the thirty years since its inception, CCD image sensors have attracted much of the research and development, thus achieving a very high level of performance with low readout noise, high dynamic range, and excellent responsivity.

At the same time, however, the functional limitations of CCDs have also become apparent. CCD fabrication process does not allow cost-efficient integration of on-chip ancillary circuits such as signal processors, and analog-to-digital converters (ADCs).

As a result, a CCD-based camera system requires not one image sensor chip, but a set of chips, which increases power consumption and hampers miniaturization of cameras. Consequently, the resurgence in CIS development is primarily motivated by the demand for an alternative imaging technology offering low cost, low power, high miniaturization, and increased functionality.

The research and development activities in the past ten years have resulted in significant advances in CIS, offering performance as competitive as CCD, but with increased functionality and lower power consumption. Circuit techniques have been introduced on-chip to reduce FPN and enhance dynamic-range.

In addition, the advancement and miniaturization of CMOS technology, driven by the tremendous growth in digital IC market, has outpaced similar improvements in CCD technology [2]. ([2]: E. R. Fossum et al, "Digital camera system on a chip," IEEE Micro, vol. 18(3), pp. 8-15, May-June 1998)

On the other hand, technology and device scaling does not always lead to better image sensor performance [3]. ([3]: H. S. Wong et al., "Technology and device scaling considerations for CMOS imagers," IEEE Transactions on Electron Devices, vol. 43(12), pp. 2131-2142, December 1996) The PN junction photodiode, commonly used in CISs, is the simplest photodetecting device and is easily integrated in a standard digital CMOS process.

Photodiode-based image sensors, however, suffer from low responsivity to input light. Thus, the main obstacle of CIS systems comes from the unscalability and low responsivity of the photosensor. The challenge then is to develop photodetectors and pixel architectures that potentially eliminate these device and process limitations.

Recently, the CIS, which is the dominant image sensor, has been used in a wide variety of applications, including digital still camera, optical mouse, and mobile phones. The CAPS usually consists of a 3-transistor (3-T) pixel or a 4-transistor (4-T) pixel. The pinned photodiode (PPD) based 4-T pixel structure has been favorably used in the CAPS due to the performance advantages of low dark current and high sensitivity compared to the 3-T pixel structure [4]. ([4]: H. Abe et al, "Device technologies for high quality and smaller pixel in CCD and CMOS image sensors," in IEDM Dig. Tech. Papers, 2004, pp. 989-992)

However, the PPD based 4-T pixel has some disadvantages, such as a small fill factor arising from the use of additional transistors, a low dynamic range associated with the small well capacity, and high cost due to the required modification in the typical logic process [5]. ([5]: H. Takahashi et al, "A 3.9-µm pixel pitch VGA format 10-b digital output CMOS image sensor with 1.5 transistor/pixel," IEEE J. Solid-State Circuits, vol. 39, pp. 2417-2425, December 2004)

SUMMARY OF THE INVENTION

In this work, a new pixel structure is proposed and implemented based on a 3-T pixel structure using a standard 0.35-µm CMOS logic process, which can improve not only the dynamic range but also the sensitivity at low illumination intensity.

For the desired performance characteristics of the proposed pixel structure, a new photogate structure is incorporated into the photodiode active-pixel structure. The proposed pixel structure exhibits the dynamic integration capacitance ($C_{int}$) characteristics, which can be controlled by varying the control-voltage at the photogate node ($V_{PG}$), Since the sensitivity is inversely proportional to $C_{int}$, the dynamic characteristics of $C_{int}$ can provide the new functionality and controllability for high sensitivity and high dynamic range.

At a low voltage level of the photogate ($V_{PG}$=0V), the pixel sensitivity of the new photogate pixel structure is maximized due to the minimum value of $C_{int}$, leading to high sensitivity with more than two-times improvement compared to the conventional pixel. At a high voltage of $V_{PG}$=3V, the dynamic range of the new structure can be maximized due to the increased well capacity with improvement more than 10 dB. Consequently, the new pixel structure allows performance tunability as well as optimization in both the dynamic range and the sensitivity of the image sensor cell.

DESCRIPTION OF THE NUMERALS ON THE MAIN PARTS OF THE DRAWINGS

201: Supply Voltage
202: Source Follower
203: Row-Select Gate
204: Pixel Output Node
205; Photodiode 1
206: Photodiode 2 by the Depletion-Layer under the Photogate
207: Photogate Node
208: Integration Node
209: Reset Gate
210: Row-Select Transistor
211: Reset Transistor
212: Photogate Transistor
301: Pixel Width
302: Photosensing Area
303: Pixel Length
304: Row-Select Transistor
305: Pixel Output Node
306: Source Follower
307: Pixel Area
308: Supply Voltage Node
309: Reset Transistor
310: Width of Photosensing Area
311: Photodiode Area
312: Integration Node
313: Photogate Node
314: Photogate
315: n+ Diffusion Area
58; 3-T Pixel Structure

DETAILED DESCRIPTION OF THE EMBODIMENTS

Figure 3:
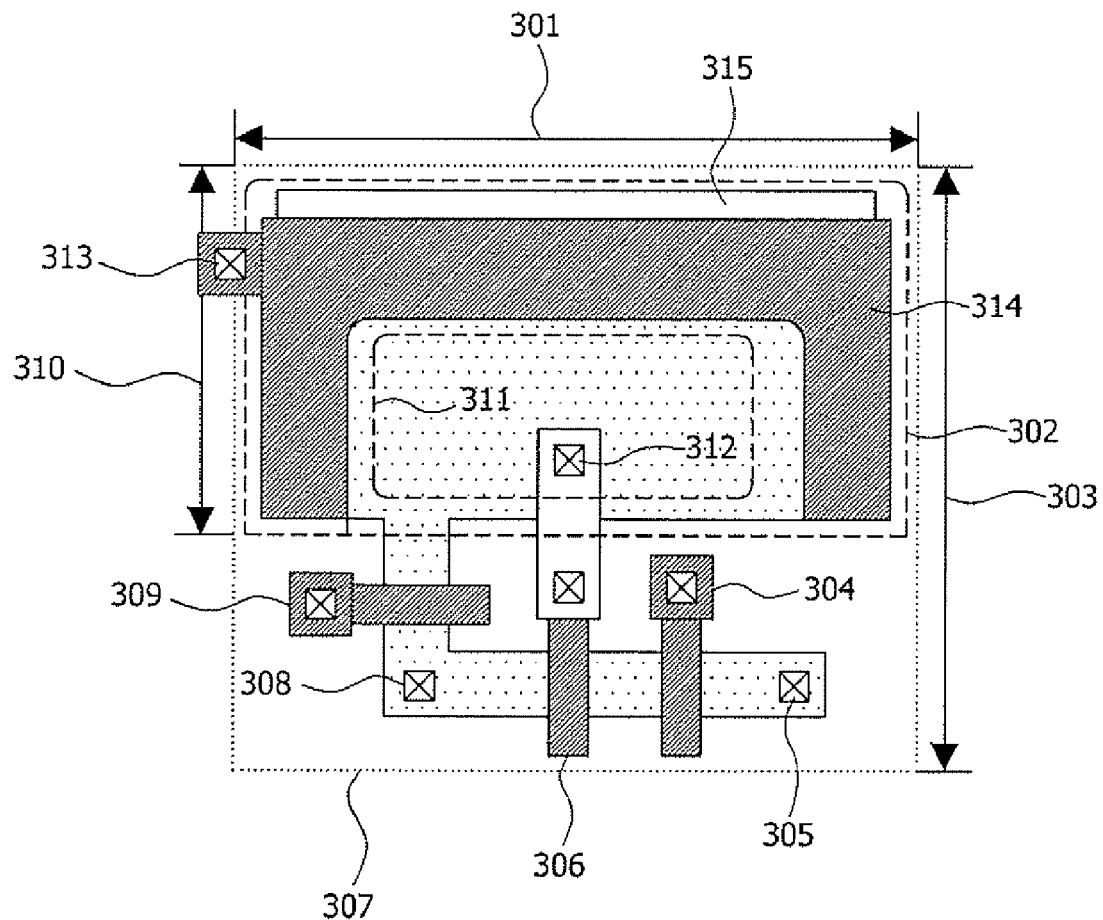
FIG. 3 is a drawing of the layout diagram of the proposed pixel structure.

The pixel layout of the new pixel structure are illustrated in FIG. 3. The pixel size ($A_{pixel}$) and fill factor (FF) of the new pixel structure are designed to be equal to those of a conventional 3-T structure, which is used in this work for performance comparison.

The overall photosensing part (302) of the new structure is composed of both a photo-gate region (314) and a photodiode region as shown in FIG. 3, which is different from the conventional structure consisting of only a photodiode region. In order to maintain a comparable quantum efficiency ($\eta$), the photo-gate in the new structure is also used as a part of photosensing region (302) with an area ratio of about 0.5 to the overall photosensing region (302). For the photo-gate material, a non-silicided thin poly-silicon layer (~250 nm) is used, which has relatively high transparency for the visible frequency band of image sensors.

Figure 1:
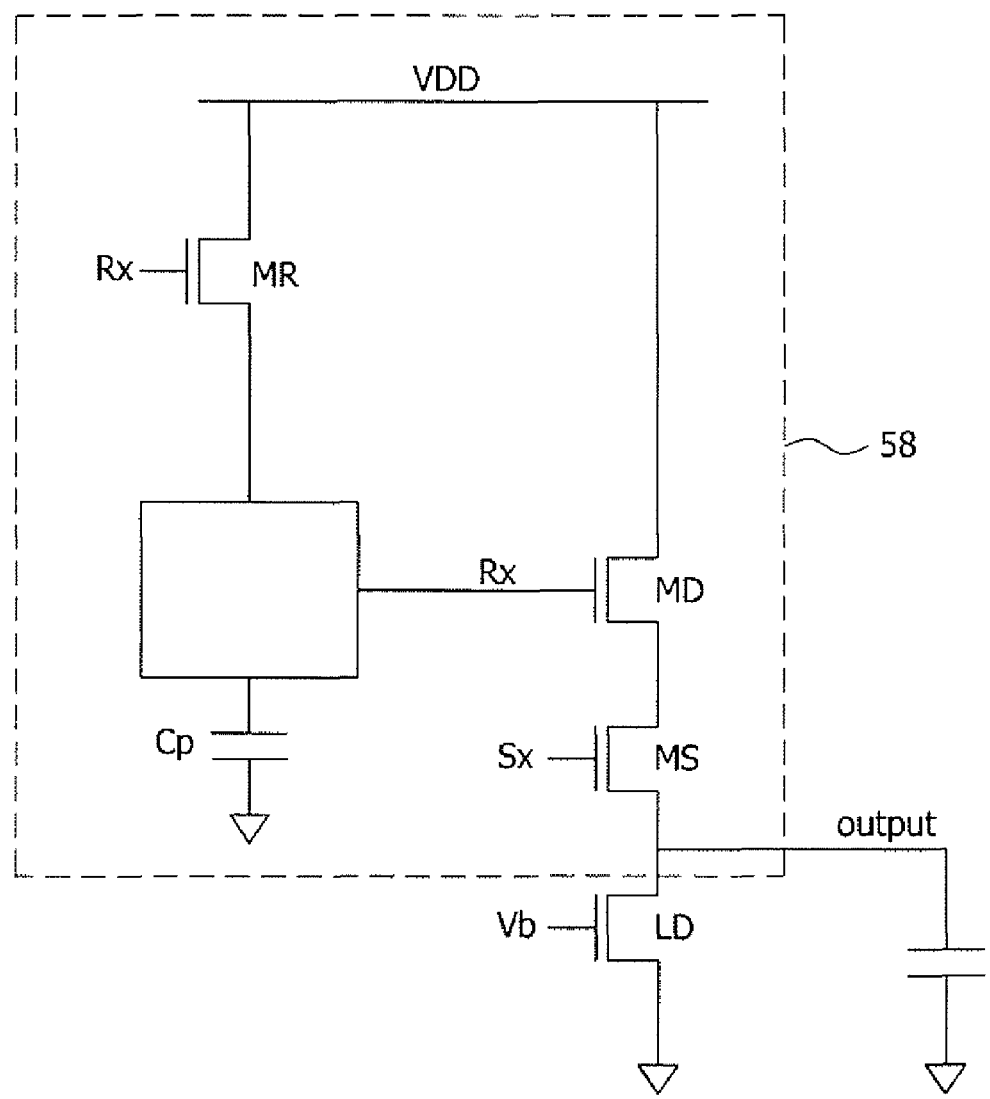
FIG. 1 is a drawing of the schematic circuit diagram of the 3-T pixel structure.
Figure 2A:
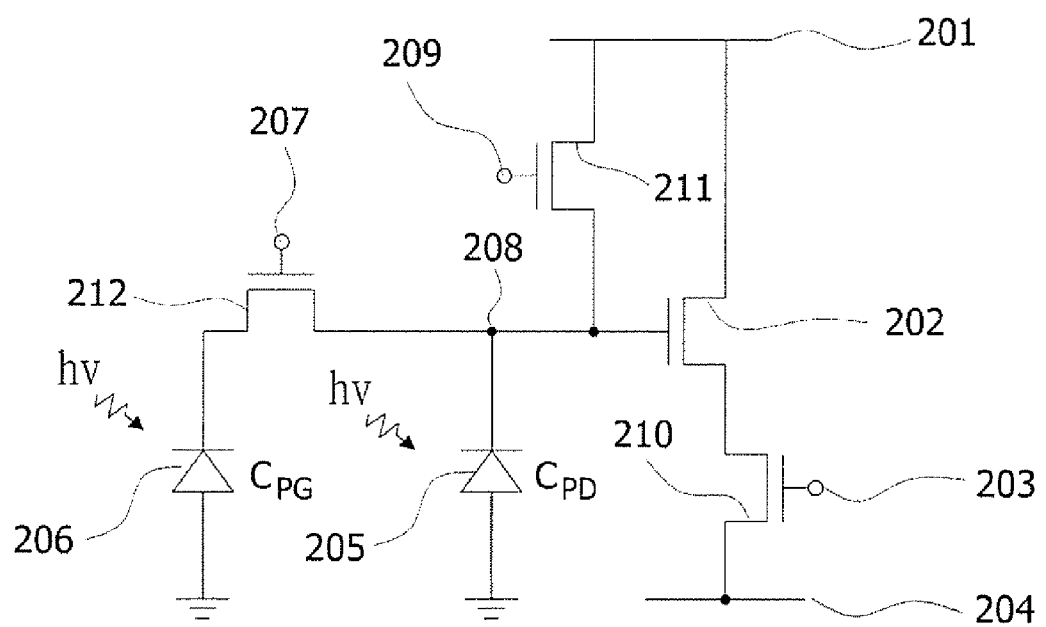
FIG. 2(a) is a drawing of the conceptual circuit diagram of the proposed photogate pixel structure.

The conceptual equivalent-circuit diagram of the new pixel structure is shown in FIG. 2(a). For the desired self-adaptive sensitivity operation and the dynamic C-V characteristics of the proposed structure, a positive control-bias voltage ($V_{PG}$: 207) is applied at the photo-gate in FIG. 2(b). The detailed operating principle of the new photo-gate pixel is as follows. Considering the same readout operation as the conventional 3-T pixel (58), the voltage level at the integration node ($V_{int}$: 208) is initially set to a reset level ($V_{reset}$) with a bias condition of $V_{PG}$ satisfying ($V_{PG}-V_{th}$)<$V_{reset}$, where $V_{th}$ is the threshold voltage of the photo-gate (212).

During the integration time ($t_{int}$), $V_{int}$ is decreased from the value of $V_{reset}$ with light illumination. When $V_{int}$ stays in a range from $V_{reset}$ to $V_{PG}-V_{th}$, the depletion-layer capacitance of the photo-gate ($C_{PG}$: 206) is electrically disconnected from the depletion capacitance of the photodiode ($C_{PD}$: 205) because of the channel pinch-off of the photo-gate with $V_{int}$>($V_{PG}-V_{th}$).

Figure 2B:
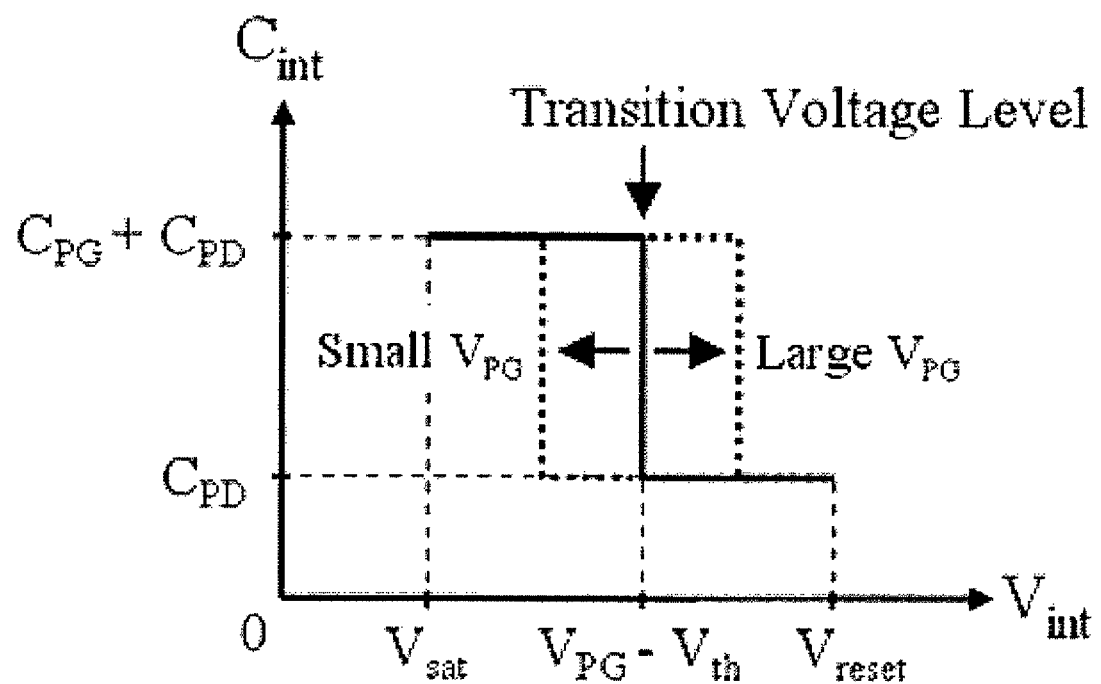
FIG. 2(b) is a drawing of the schematic C-V characteristics at the integration node ($V_{int}$) of the proposed photogate pixel structure, which can be controlled by varying the photogate bias voltage.

Thus, the effective integration-capacitance ($C_{int}$) at the integration node of $V_{int}$ in FIG. 2(a) becomes $C_{PD}$ in this case, as shown schematically in FIG. 2(b). Then, when $V_{int}$ is further decreased below $V_{PG}-V_{th}$, $C_{PG}$ is electrically connected to $C_{PD}$ through the channel formed under the photogate, resulting in an increased $C_{int}$ of $C_{int}=C_{PG}+C_{PD}$. Hence, the new pixel structure can exhibit the dynamic $C_{int}$ characteristics with a transition voltage at $V_{PG}-V_{th}$, which can be controlled by $V_{PG}$. Since the sensitivity (S) of the pixel is inversely proportional to $C_{int}$ as follows:

$$S = A_{Pixel} \cdot FF \cdot \frac{\lambda(\mu m) \cdot QE}{1.24 \cdot C_{int}} \quad (1)$$

the dynamic characteristics of $C_{int}$ can provide the desired self-adaptive sensitivity operation for the new pixel structure. In addition, the new structure can also demonstrate high sensitivity especially at low illumination intensity due to the small $C_{int}$ of $C_{PD}$ at around $V_{int}=V_{reset}$, as shown in FIG. 2(b).

In order to improve the dynamic range (DR) while maintaining the high sensitivity performance at low illumination intensity, it is required to maximize the well capacity ($Q_{well}$) of the pixel, which is expressed as follows for the new photo-gate structure:

$$Q_{well} = \int_{V_{sat}}^{V_{PG}-V_{th}} (C_{PG} + C_{PD}) \, dV_{int} + \int_{V_{PG}-V_{th}}^{V_{reset}} C_{PD} \, dV_{int} \quad (2)$$

where $V_{sat}$ is the output saturation voltage level. The proposed photo-gate structure allows to optimize $Q_{well}$ electrically by varying $V_{PG}$.

The dynamic range of the pixel sensor is determined by $Q_{well}$ and also by the other parameters, such as the dark current ($i_{dark}$) and the total read noise ($\sigma_r$) as shown in the following equation:

$$DR = 20 \log \left[ \frac{\frac{Q_{well}}{t_{int}} - I_{Dark}}{\frac{q}{t_{int}} \sqrt{\left[\frac{1}{q} I_{Dark} \cdot t_{int}\right]^2 + \left[\frac{\sqrt{kTC_{int}}}{q}\right]^2 + \sigma_R^2}} \right] [dB]$$

In order to reduce $i_{dark}$, the photodiode region (311) of the pixel is isolated in the proposed structure from the defective field oxide border. In addition, the pulse form of the reset signal can also be designed to minimize $\sigma_r$. Consequently, at an optimum $V_{PG}$, the dynamic range as well as the sensitivity at low illumination intensity can be simultaneously improved by using the proposed photo-gate pixel structure.

Figure 4:
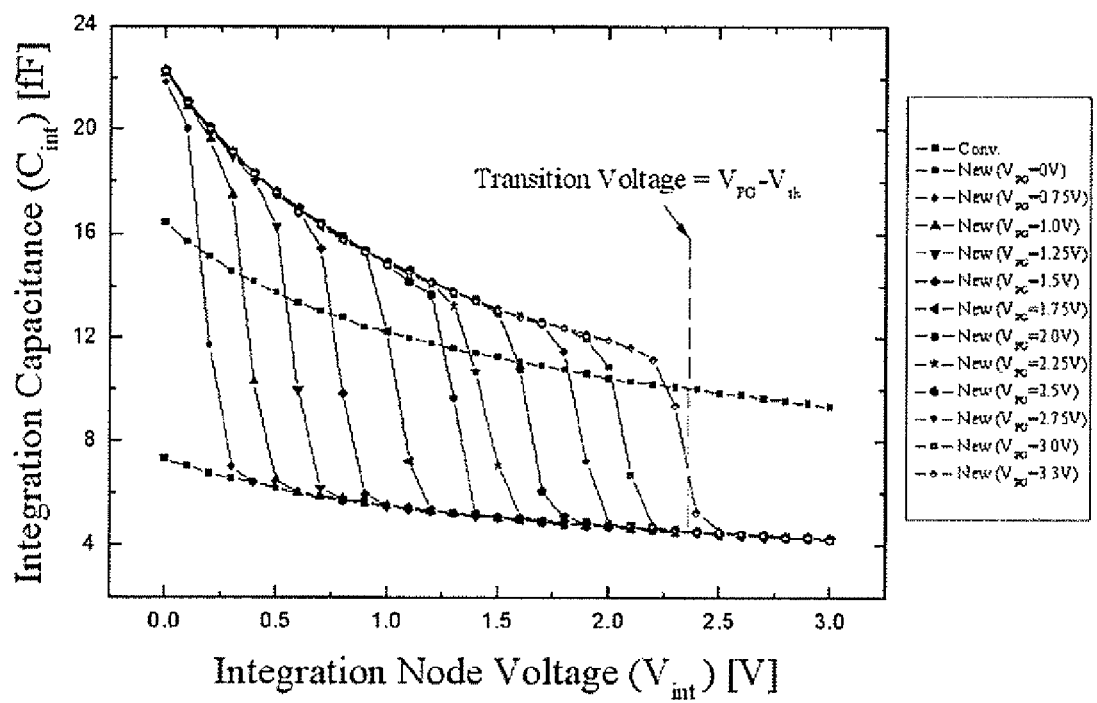
FIG. 4 is a graph of the measured C-V characteristics of $C_{int}$ vs. $V_{int}$ as a function of the photogate bias voltage ($V_{PG}$).
Figure 5:
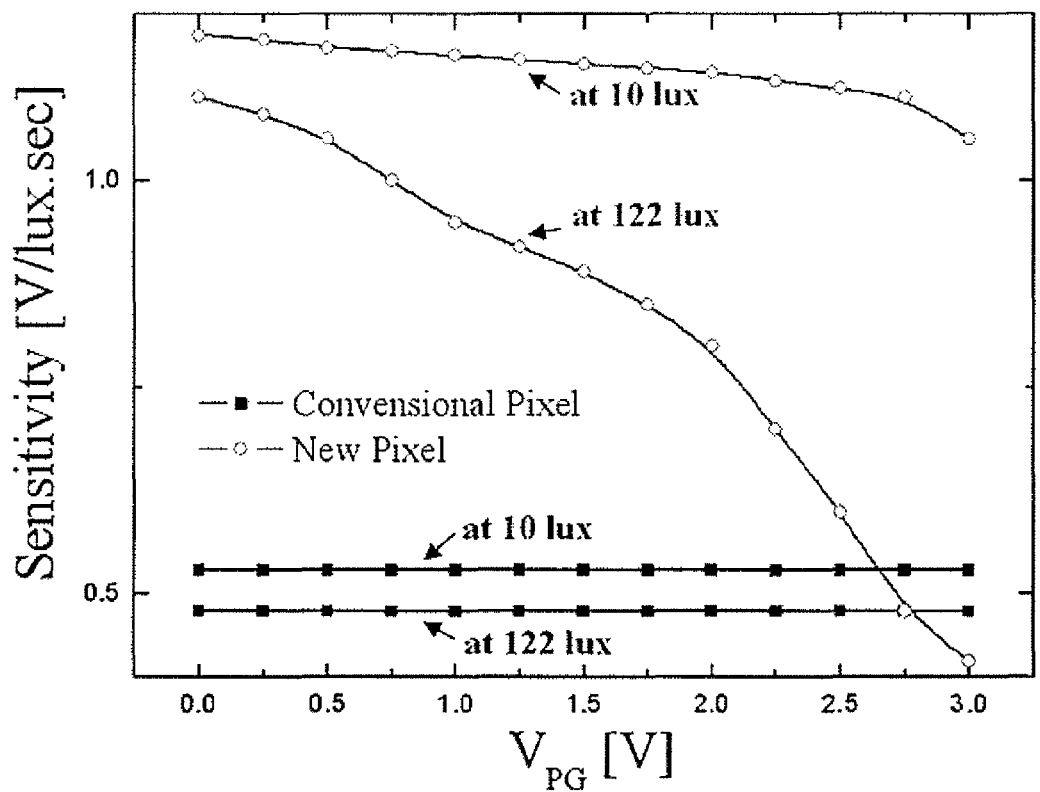
FIG. 5 is a graph of the measured pixel sensitivity for the illumination intensity of both 10 lux and 122 lux as a function of $V_{PG}$ for the new structure in comparison with the conventional structure.
Figure 8:
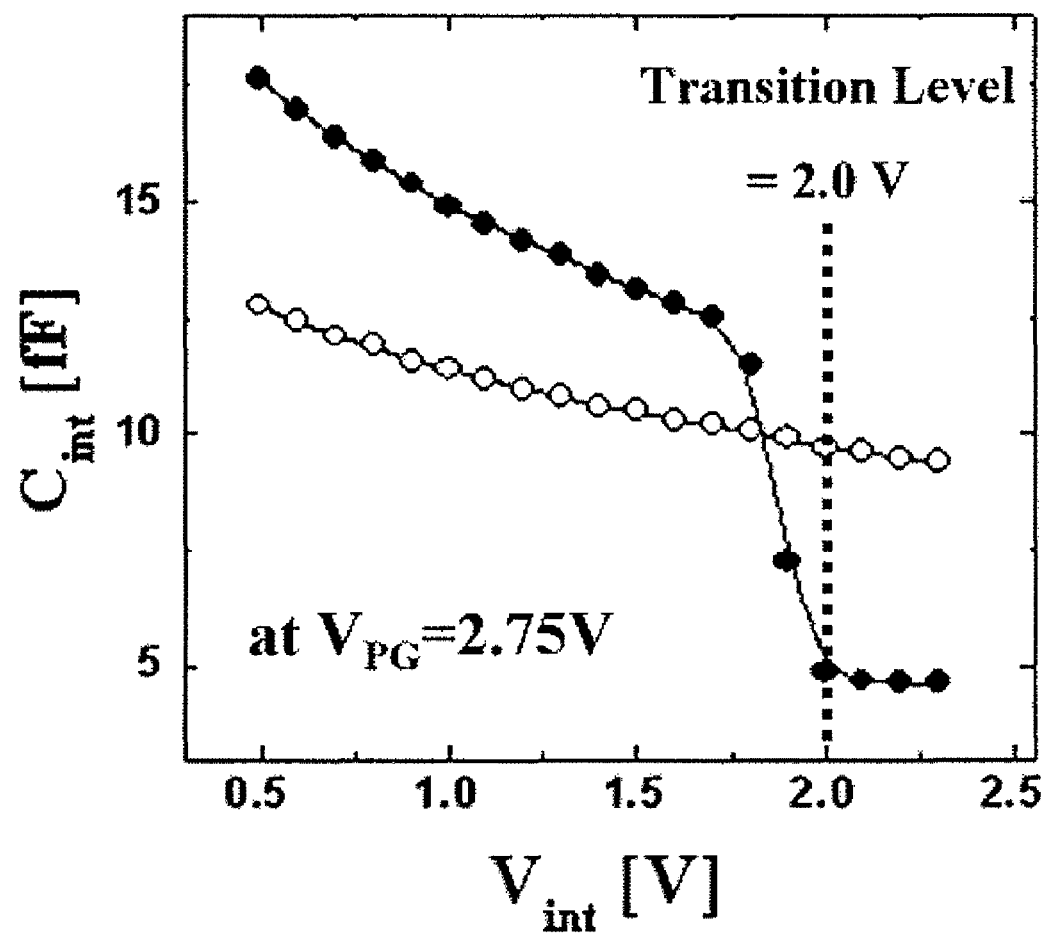
FIG. 8 is a graph drawing of the measured C-V characteristics of $C_{int}$ vs. $V_{int}$ for the case of $V_{PG}$=2.5V.

The FIG. 4 shows the measured C-V characteristics of the proposed photo-gate pixel structure in comparison with the conventional 3-T reference pixel structure. The FIG. 8 shows the measured sensitivity vs. $V_{PG}$. For the new structure, $V_{PG}$ is the case of 2.75V. As shown in FIG. 8, the new pixel structure exhibits the intended dynamic characteristics of $C_{int}$ with a transition voltage at around $V_{int}$=2V, whereas the conventional structure shows the nearly constant characteristic.

For the observation of dynamic sensitivity operation in the photo-gate pixel structure depending on the illumination intensity, the pixel sensitivity was measured at two levels of illumination intensity; one at low illumination intensity of 10 lux and the other at high illumination intensity of 500 lux. For a uniform source of light illumination, a 3200K tungsten-halogen lamp was used in the measurement. The mean sensitivity value of the photo-gate structure is 1.1 V·lux$^{-1}$·sec$^{-1}$ at 10 lux, which is two-times larger than that of the conventional structure. This is mainly because the $C_{int}$ of the new structure at $V_{int}$>2V is smaller than that of the conventional structure by a factor of more than two, as shown in FIG. 8.

The measured value of η in the photo-gate pixel structure was found to be about 10% less than that of the conventional photodiode pixel. At the high illumination intensity of 500 lux, the mean sensitivity value of the new photo-gate structure is considerably smaller than that of the conventional structure. This is because the charge-to-conversion gain is reduced by the large $C_{int}$ at $V_{int}$<2V as shown in FIG. 8, which can lead to the increased capacity of light detection for the proposed pixel up to the output saturation level.

Figure 6:
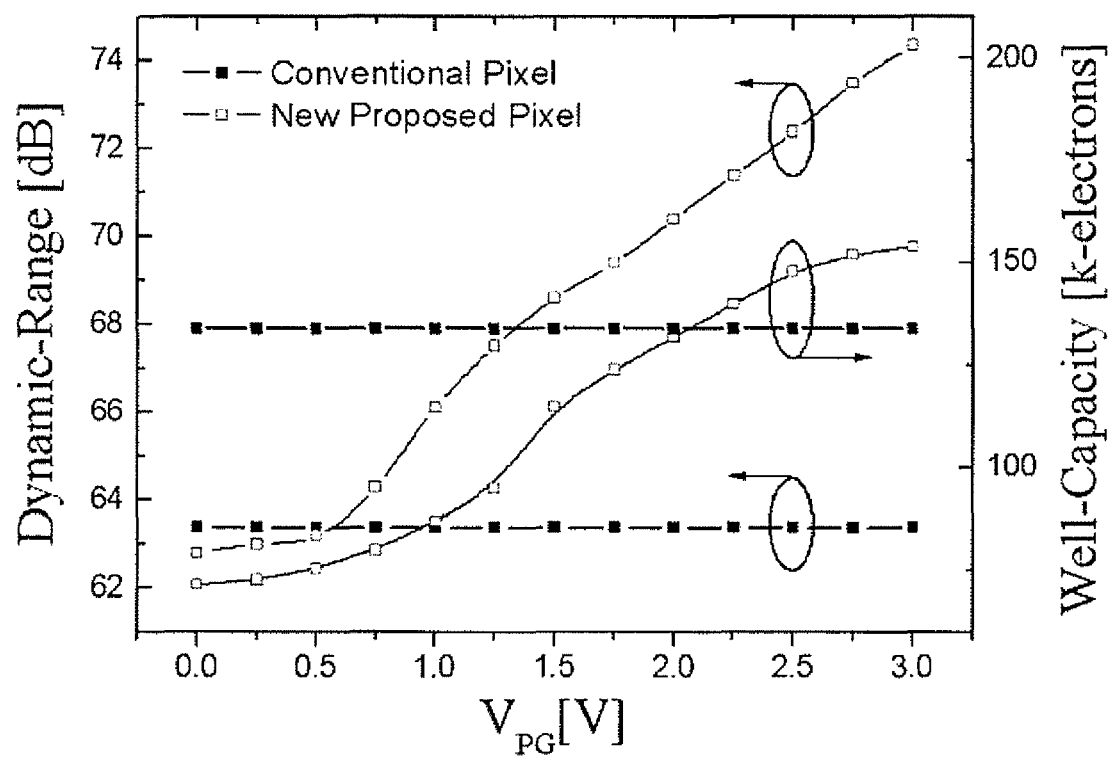
FIG. 6 is a graph of the measured well-capacity and dynamic range as a function of $V_{PG}$ for the new structure in comparison with the conventional structure.
Figure 7:
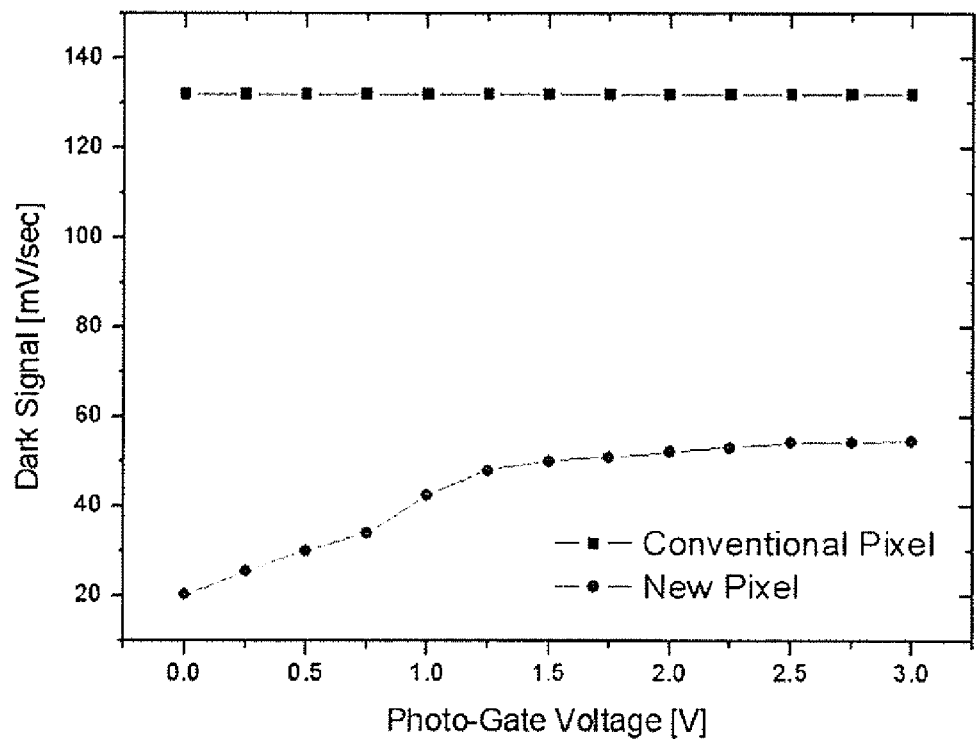
FIG. 7 is a graph drawing of the measured dark-signal as a function of $V_{PG}$ for the new structure in comparison with the conventional structure.

The measured dynamic range and dark signal level of the photo-gate pixel structure as a function of $V_{PG}$ are shown in FIG. 6 and FIG. 7 respectively. The dark signal of the new structure is reduced by more than 55% compared to that of the conventional pixel structure (see FIG. 7).

The dynamic range (DR) in the photo-gate pixel increases by increasing $V_{PG}$, as shown in FIG. 6. This is because the $Q_{well}$ of the new photo-gate structure increases significantly with the increase of $V_{PG}$, while $i_{dark}$ increases only slightly and saturates at a high $V_{PG}$. At $V_{PG}$=2.75 V, the dynamic range of the new pixel structure is 73.5 dB, which shows an improvement of more than 10 dB compared to the reference 3-T pixel structure. Moreover, the dynamic range of the new photo-gate pixel structure is found to be about 10 dB larger than that of the previously reported PPD 4-T pixel structures.

Figure 9:
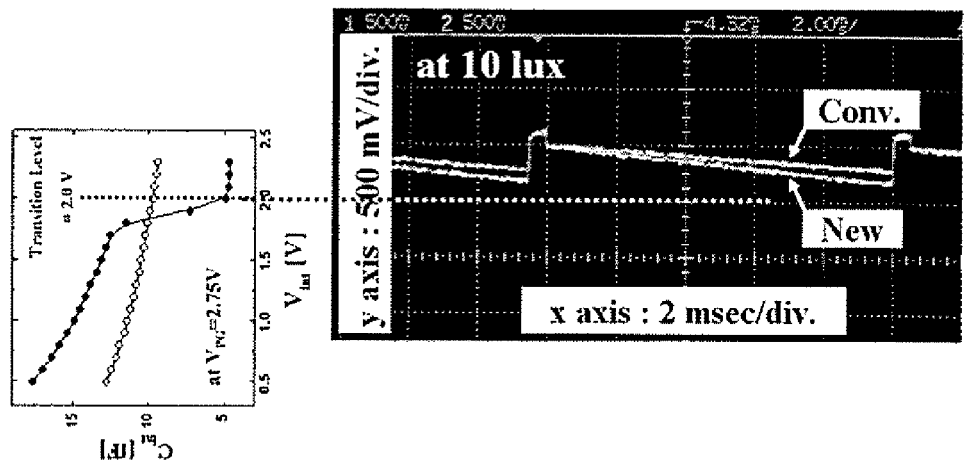
FIG. 9 is drawing of the measured output voltage waveform for the new structure for $V_{PG}$=2.75V at 10 lux for high sensitivity (x-axis: time, y-axis: output voltage for the typical case of tint (integration time)=10 ms). The performance of the conventional structure is also compared.
Figure 10:
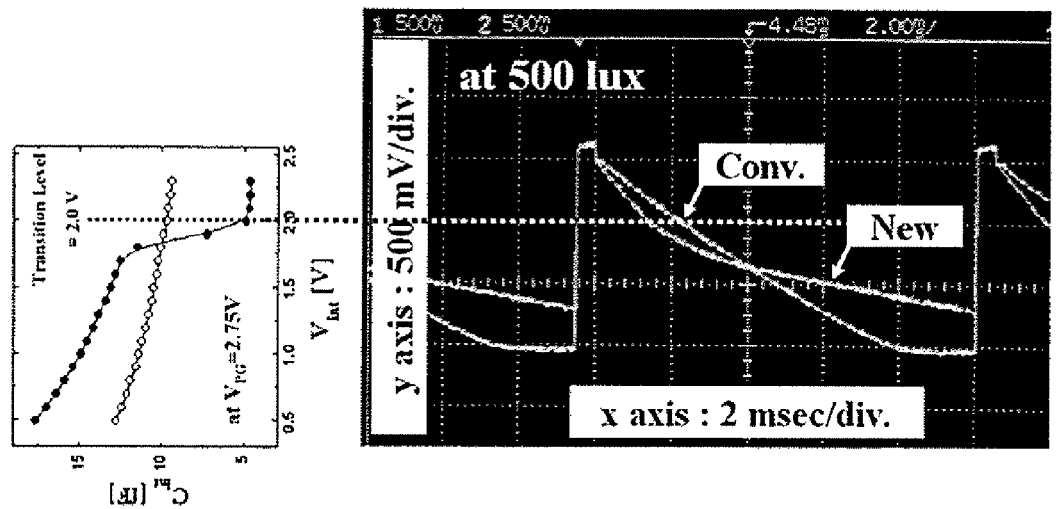
FIG. 10 is drawing of the measured output voltage waveform for the new structure for $V_{PG}$=2.75V at 500 lux for high dynamic-range (x-axis: time, y-axis: output voltage for the typical case of tint (integration time)=10 ms). The performance of the conventional structure is also compared.

FIG. 9 and FIG. 10 show the measured output voltage waveforms for the two structures. It has been found that the new pixel structure demonstrates a more pronounced non-linear characteristic in the output voltage waveform especially at illumination intensity larger than about 50 lux due to the dynamic behavior of $C_{int}$.

The photo-gate pixel structure does not reach the saturation level even at 500 lux as shown in FIG. 10 due to the self-adaptive non-linear C-V characteristics, although the conventional structure reaches the saturation at much lower illumination intensity of 400 lux. The output voltage of the photo-gate pixel saturates at much higher intensity of 850 lux.

A new photo-gate pixel structure (see FIG. 2(a) and FIG. 3) was proposed based on the standard CMOS logic process. At a low voltage level of the photogate ($V_{PG}$=0V), the pixel sensitivity of the new photogate pixel structure is maximized due to the minimum value of $C_{int}$, leading to high sensitivity with more than two-times improvement compared to the conventional pixel. At a high voltage of $V_{PG}$=3V, the dynamic range of the new structure can be maximized due to the increased well capacity ($Q_{WELL}$) with improvement more than 10 dB. In addition, at an optimum bias condition of the proposed photo-gate, both the dynamic range and the low-intensity sensitivity were significantly improved due to the self-adaptive photosensing operation.

Consequently, the new pixel structure allows performance tunability as well as optimization in both the dynamic range and the sensitivity of the image sensor cell.

The results demonstrate that the proposed photo-gate pixel structure is very promising for high-performance CMOS active pixel-sensor applications, where high versatility and high controllability are essential for the overall performance optimization.

What is claimed is:

1. A pixel structure, comprising:
   a photogate; and
   a photodiode,
   wherein an integration capacitance characteristic of the pixel structure is controlled by applying a constant bias voltage ($V_{PG}$) to the photogate during an integration period of the pixel structure,
   an integration capacitance of the pixel structure switches between a low value and a high value, thereby changing a sensitivity and a dynamic range of the pixel structure,
   the constant bias voltage $V_{PG}$ satisfies the relationship $V_{reset} > V_{PG} - V_{th}$, with $V_{reset}$ being a reset level and $V_{th}$ being a threshold voltage of the photogate,
   the photodiode is isolated from a defective field oxide border to reduce a dark current,
   the integration capacitance of the pixel structure in a first state is equal to an integration capacitance of the photodiode,
   the integration capacitance of the pixel structure in a second state is equal to a sum of the integration capacitance of the photodiode and an integration capacitance of the photogate,
   during the integration period, photo-generated majority carriers are collected at an integration node, decreasing a voltage ($V_{int}$) at the integration node below $V_{reset}$, and when $V_{int} > V_{PG} - V_{th}$, a cathode region of the photodiode is disconnected from a depletion layer of the photogate due to a pinch-off phenomena, thereby causing the integration capacitance to equal an integration capacitance of the photodiode, and causing high sensitivity at a low illumination intensity.

2. The pixel structure according to claim 1, wherein an optimum bias condition of the photogate results in both a high dynamic range and a high sensitivity at a low light intensity.

3. The pixel structure of claim 2, wherein the optimum bias condition is $V_{reset} > V_{PG} - V_{th} > V_{sat}$, wherein $V_{sat}$ is a saturation level of the voltage at the integration node.

4. A pixel structure, comprising:

a photogate; and a photodiode, wherein an integration capacitance characteristic of the pixel structure is controlled by applying a constant bias voltage ($V_{PG}$) to the photogate during an integration period of the pixel structure, an integration capacitance of the pixel structure switches between a low value and a high value, thereby changing a sensitivity and a dynamic range of the pixel structure, the constant bias voltage $V_{PG}$ satisfies the relationship $V_{reset} > V_{PG} - V_{th}$, with $V_{reset}$ being a reset level and $V_{th}$ being a threshold voltage of the photogate, the photodiode is isolated from a defective field oxide border to reduce a dark current, the integration capacitance of the pixel structure in a first state is equal to an integration capacitance of the photodiode, the integration capacitance of the pixel structure in a second state is equal to a sum of the integration capacitance of the photodiode and an integration capacitance of the photogate, and when a voltage ($V_{int}$) at an integration node satisfies the relationship $V_{int} < V_{PG} - V_{th}$, a cathode region of the photodiode is connected to a depletion layer of the photogate, causing the integration capacitance of the pixel structure to be equal to a sum of the integration capacitance of the photodiode and an integration capacitance of the photogate, and causing a high dynamic range at a high illumination intensity.

5. The pixel structure according to claim 4, wherein an optimum bias condition of the photogate results in both a high dynamic range and a high sensitivity at a low light intensity.

* * * * *